United States Patent
Gery et al.

(10) Patent No.: US 10,882,714 B2
(45) Date of Patent: Jan. 5, 2021

(54) WINDING HEAD FOR A TORROIDAL WINDING MACHINE, TORROIDAL WINDING MACHINE COMPRISING SUCH A WINDING HEAD AND METHOD

(71) Applicant: Schneider Electric Industries SAS, Rueil Malmaison (FR)

(72) Inventors: Frederic Gery, Echirolles (FR); Philippe Brunel, Eybens (FR); David Granier, Apprieu (FR); Michel Pelletier, La Croix de la Pochette (FR)

(73) Assignee: Schneider Electric Industries SAS, Rueil Malmaison (FR)

( * ) Notice: Subject to any disclaimer, the term of this patent is extended or adjusted under 35 U.S.C. 154(b) by 59 days.

(21) Appl. No.: 15/895,347

(22) Filed: Feb. 13, 2018

(65) Prior Publication Data

US 2018/0290857 A1 Oct. 11, 2018

(30) Foreign Application Priority Data

Apr. 6, 2017 (FR) ...................................... 17 52997

(51) Int. Cl.
*B65H 54/04* (2006.01)
*H01F 41/082* (2016.01)
(Continued)

(52) U.S. Cl.
CPC ............. *B65H 54/04* (2013.01); *B65H 54/22* (2013.01); *G01R 3/00* (2013.01); *G01R 15/181* (2013.01);
(Continued)

(58) Field of Classification Search
CPC .......... B65H 54/04; B65H 54/22; B65H 7/04; G01R 15/18; G01R 3/00; H01F 41/0206; H01F 41/082; H01F 41/088
See application file for complete search history.

(56) References Cited

U.S. PATENT DOCUMENTS 263,780 A * 9/1882 Haase et al. ........... B29D 30/48
242/434.5
302,627 A * 7/1884 Espeut .................... H01F 41/08
242/434.5

(Continued)

FOREIGN PATENT DOCUMENTS

EP  0 225 316    6/1987
FR  2 474 468    7/1981
GB     820798 A * 9/1959 ............. B21F 17/00

OTHER PUBLICATIONS

French Preliminary Search Report dated Dec. 21, 2017 in French Application 17 52997 filed on Apr. 6, 2017 (with English Translation of Categories of Cited Documents).

*Primary Examiner* — Emmanuel M Marcelo
(74) *Attorney, Agent, or Firm* — Oblon, McClelland, Maier & Neustadt, L.L.P.

(57) ABSTRACT

A winding head includes an annular magazine for storing the quantity of wire required to wind a torus, a first mechanism for driving the magazine in rotation, and a traveler for guiding the wire, at the output of the magazine, around the torus. The winding head includes a second mechanism, distinct from the first mechanism, for driving the traveler in rotation, such that the magazine and the traveler can be driven in rotation independently of one another.

11 Claims, 14 Drawing Sheets

Figure 1:
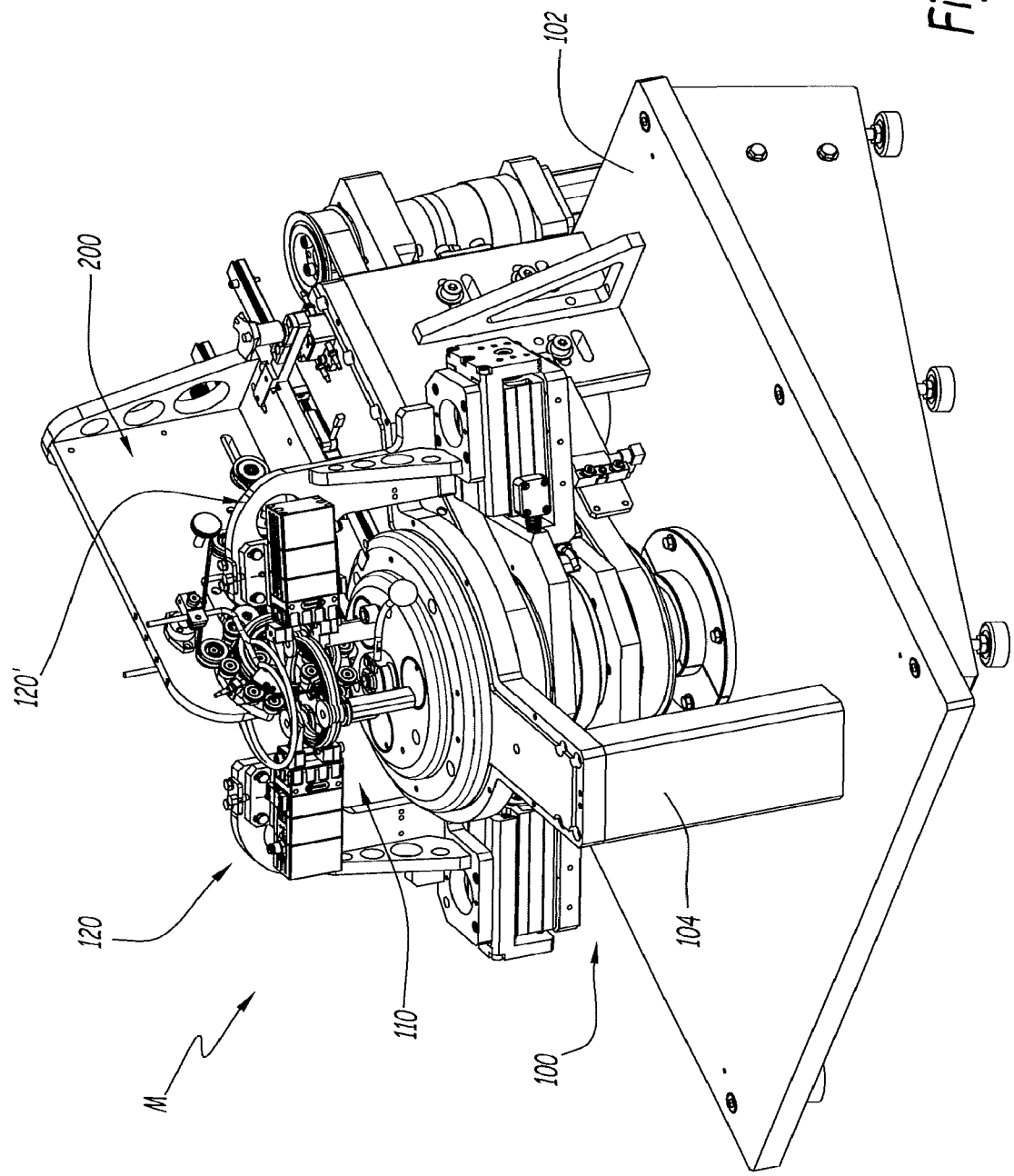

(51) Int. Cl.
*H01F 41/088* (2016.01)
*H01F 41/02* (2006.01)
*B65H 54/22* (2006.01)
*G01R 3/00* (2006.01)
*G01R 15/18* (2006.01)

(52) U.S. Cl.
CPC ........... *H01F 41/02* (2013.01); *H01F 41/082* (2016.01); *H01F 41/088* (2016.01)

(56) References Cited

U.S. PATENT DOCUMENTS

| | | | | |
|---|---|---|---|---|
| 700,713 A | * | 5/1902 | Wright | B29D 30/48 242/434.5 |
| 802,359 A | * | 10/1905 | Nickel | H01F 41/08 242/434.4 |
| 2,331,674 A | * | 10/1943 | Fox | H01F 41/08 242/434.4 |
| 2,437,309 A | * | 3/1948 | Veatch | H01F 41/08 242/434.5 |
| 3,383,059 A | * | 5/1968 | Fahrbach | H01F 41/08 242/434.9 |
| 3,412,948 A | * | 11/1968 | Fahrbach | H01F 41/08 242/482.8 |
| 3,559,899 A | * | 2/1971 | Fahrbach | H01F 41/08 242/434.2 |
| 4,637,563 A | * | 1/1987 | Arii | H01F 41/08 242/434.3 |
| 4,771,957 A | * | 9/1988 | Schlake | H01F 41/08 242/437.1 |
| 4,884,758 A | * | 12/1989 | Hamkins | H01F 41/08 242/437.1 |
| 4,917,318 A | * | 4/1990 | Schlake | H01F 41/08 242/434.4 |
| 2001/0015393 A1 | | 8/2001 | Miyazaki et al. | |
| 2005/0242227 A1 | | 11/2005 | Takeda et al. | |
| 2018/0090270 A1 | * | 3/2018 | Hofer | H01F 41/094 |

* cited by examiner

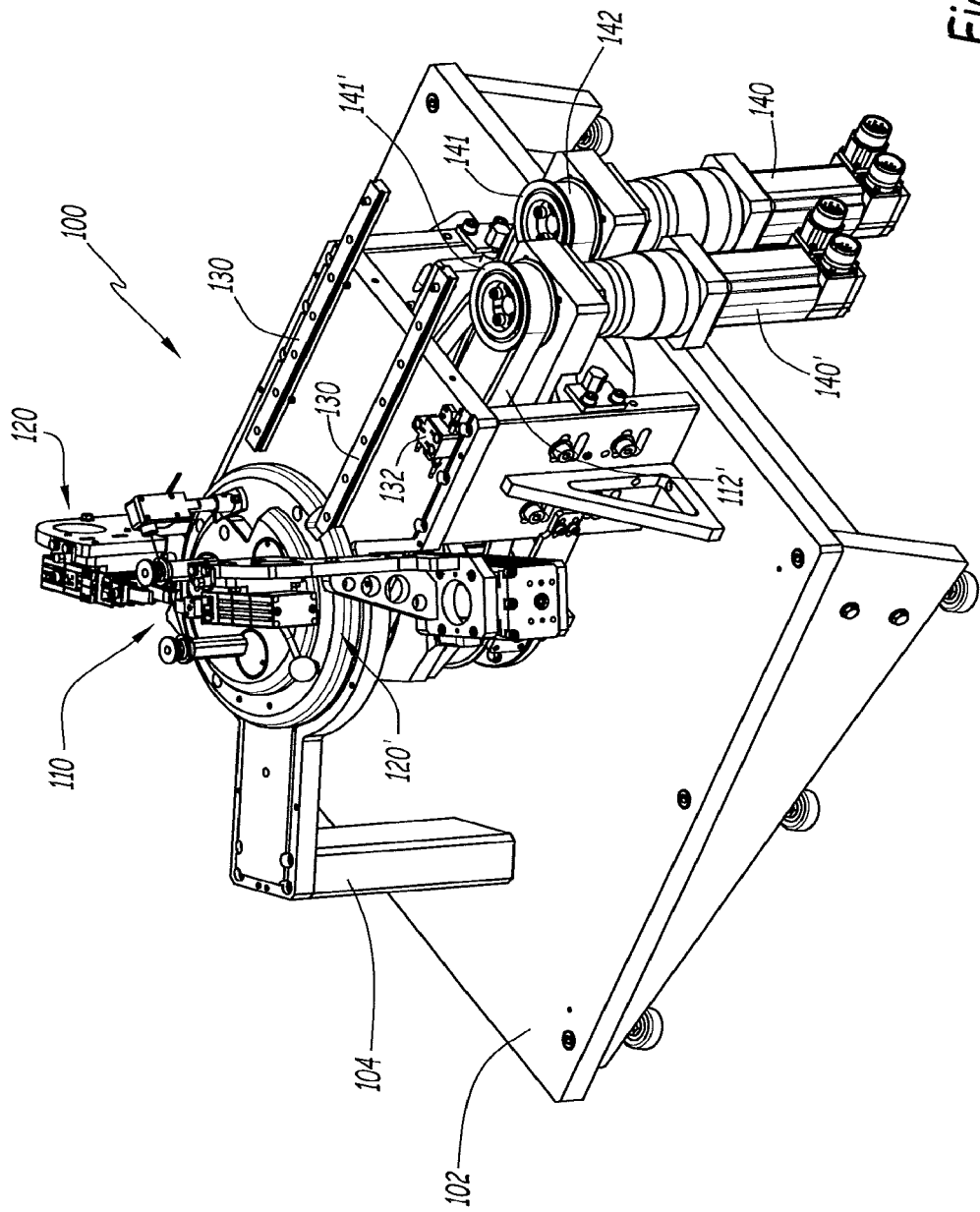

WINDING HEAD FOR A TORROIDAL WINDING MACHINE, TORROIDAL WINDING MACHINE COMPRISING SUCH A WINDING HEAD AND METHOD

The present invention relates to a winding head for a toroidal winding machine. Such a machine in particular allows the production of wound toruses to obtain current sensors with a high level of accuracy.

As is known, a toroidal winding machine comprises a winding table and a winding head. The winding table supports the torus to be wound. It comprises means for driving the torus in rotation about its axis. The winding head is the member of the machine that makes it possible to wind the torus, that is to say to wind on a copper wire over all the circumference of the torus.

In this field, RUFF GmbH notably uses a machine called "RWE Evolution". The winding head of this machine comprises what is called a magazine, which is an annular piece used to store the quantity of wire required to wind the torus. In particular, the winding is wound on inside a peripheral groove of the magazine. In this example, the magazine comprises a removable section to allow the passage of the torus.

The winding head also comprises what is called a traveler, which is a piece added onto a side wall of the magazine and which has two functions. The first function of the traveler is to guide the winding wire, at the output of the magazine, around the torus to be wound. To this end, the traveler comprises a groove for the passage of the winding wire. The other function of the traveler is to apply tension to the winding wire. In this example, the magazine and the traveler are linked to one another by a dovetail link: the traveler comprises a trapezoidal tenon, which is engaged inside a corresponding peripheral groove formed on a side wall of the magazine. The traveler also comprises a wire, of piano wire type, which generates, by friction in the groove, a permanent drag torque.

The operation of this machine is as follows. First of all, the removable section of the magazine is removed so as to be able to position the section of the torus to be wound generally in the centre of the magazine. Then, the section is put back into place. Next, an end of the wire is attached to the magazine and the magazine is rotated, so as to wind on the quantity of winding wire required to wind the torus. This is called a magazine loading phase. Once this loading operation is completed, the wire is cut. The free end of the wire is passed around an element of the torus, such as a pin or a segment of the torus, by executing a few dead turns, then is immobilized using a hanger system. The winding can then begin. For that, the magazine is rotated, which has the effect of applying tension to the wire. The tension of the wire drives the displacement of the traveler along the magazine, and therefore around the section of the torus to be wound. The torus is driven in rotation synchronously, so as to obtain a winding over all the circumference. The wire is kept under tension throughout the winding operation by virtue of the frictions of the piano wire which brakes the displacement of the traveler.

This machine does present a number of drawbacks. Firstly, the magazine and the traveler wear rapidly because of the frictions caused by the dovetail link and therefore have to be replaced frequently. That also requires a burning-in of the new magazine/traveler pair (thus generating a forced pairing) then the resumption of the winding programs to adapt to the new mechanical conditions of the machine. Furthermore, the displacement of the traveler along the magazine generates dust. Thus, the servicing of the machine (cleaning and replacement of wear pieces) is relatively costly.

Secondly, the tension of the wire during the winding operation cannot be controlled. Effectively, the tension value is imposed by the characteristics of the assembly between the magazine and the traveler, and in particular by the friction loads between the traveler and the magazine. It is not therefore possible to adjust the tension value as a function of the diameter of the wire to be wound for example. Thirdly, the travelers being pieces machined manually, their dimensions and their form are variable from one piece to another. That leads to dispersions in the tension value of the winding wire, and therefore a poor repeatability. The winding quality, that is to say the regularity of the laying of the turns (the pitch), is, also, variable.

It is these drawbacks that the invention sets out more particularly to remedy by proposing a winding head that makes it possible to control the tension value of the winding wire and with a lesser servicing cost.

To this end, the invention relates to a winding head for a toroidal winding machine, the winding head comprising an annular magazine for storing the quantity of wire required to wind a torus, a first mechanism for driving the magazine in rotation, and a traveler for guiding the wire, at the output of the magazine, around the torus. The winding head comprises a second mechanism, distinct from the first mechanism, for driving the traveler in rotation, such that the magazine and the traveler can be driven in rotation independently of one another.

By virtue of the invention, the tension value of the winding wire can be controlled by adjusting the speed of the traveler in relation to that of the magazine. The same tension value can then be used for each torus of a series (repeatable nature), so that all the wound toruses exhibit the same regularity with regard to the positioning of the turns and therefore the same winding quality.

Furthermore, the traveler and the magazine are mechanically independent of one another and no longer rub against one another during the winding operation. Thus, the magazine and the traveler do not wear, or almost do not wear, and there is no need to replace them periodically.

Also, the winding tension can be changed during the cycle. That is notably beneficial when the torus comprises several layers of wire. Actually, developments have shown that the tension of the wire of the second layer should preferably be lower than that of the first layer, so as to limit the impact of the laying of the second layer on the first layer, and therefore the interleaving of the turns.

According to advantageous, but nonmandatory, aspects of the invention, such a winding head can incorporate one or more of the following features, taken in any technically admissible combination:

The traveler is fixed onto a side wall of a wheel mounted coaxially inside the magazine.

The magazine and the wheel extend over an angular segment less than 360° and thus define a permanent aperture for the passage of the torus.

The winding head comprises first guiding means, for guiding the magazine in rotation, and second guiding means, distinct from the first guiding means, for guiding the rotation of the traveler.

The invention relates also to a toroidal winding machine comprising a winding head as described above and a winding table designed to support and pivot a torus during a winding sequence.

According to advantageous, but nonmandatory, aspects of the invention, such a machine can incorporate one or more of the following features, taken in any technically admissible combination:

- The winding table comprises first means for supporting and guiding the torus in rotation and second means for driving the torus in rotation, distinct from the first means. The first means are formed by a concentric gripping clamp.
- The concentric gripping clamp comprises three rollers positioned such that each roller remains permanently equidistant from the other two rollers.
- Each roller is mounted on a cylinder fixed eccentrically onto a rotary pinion, while all the rotary pinions are meshed with a central pinion.
- An axis of rotation of the torus coincides with a central axis of the concentric gripping clamp.
- The winding table comprises means for adjusting the winding head depthwise.
- The depthwise adjustment means are configured to displace the winding head in a plane radial to an axis of rotation of the torus.

The invention relates finally to a method for winding a torus by means of a machine as defined previously, the method comprising steps of a) positioning the torus in the concentric gripping clamp, b) displacing the winding head until it reaches a position where a section of the torus to be wound is substantially at the centre of a circle described by the traveler, c) using the second means to rotate the torus, and d) displacing the magazine and the traveler in rotation about the section of the torus so as to reel off wire stored in the magazine around the section of the torus.

Figure 2:
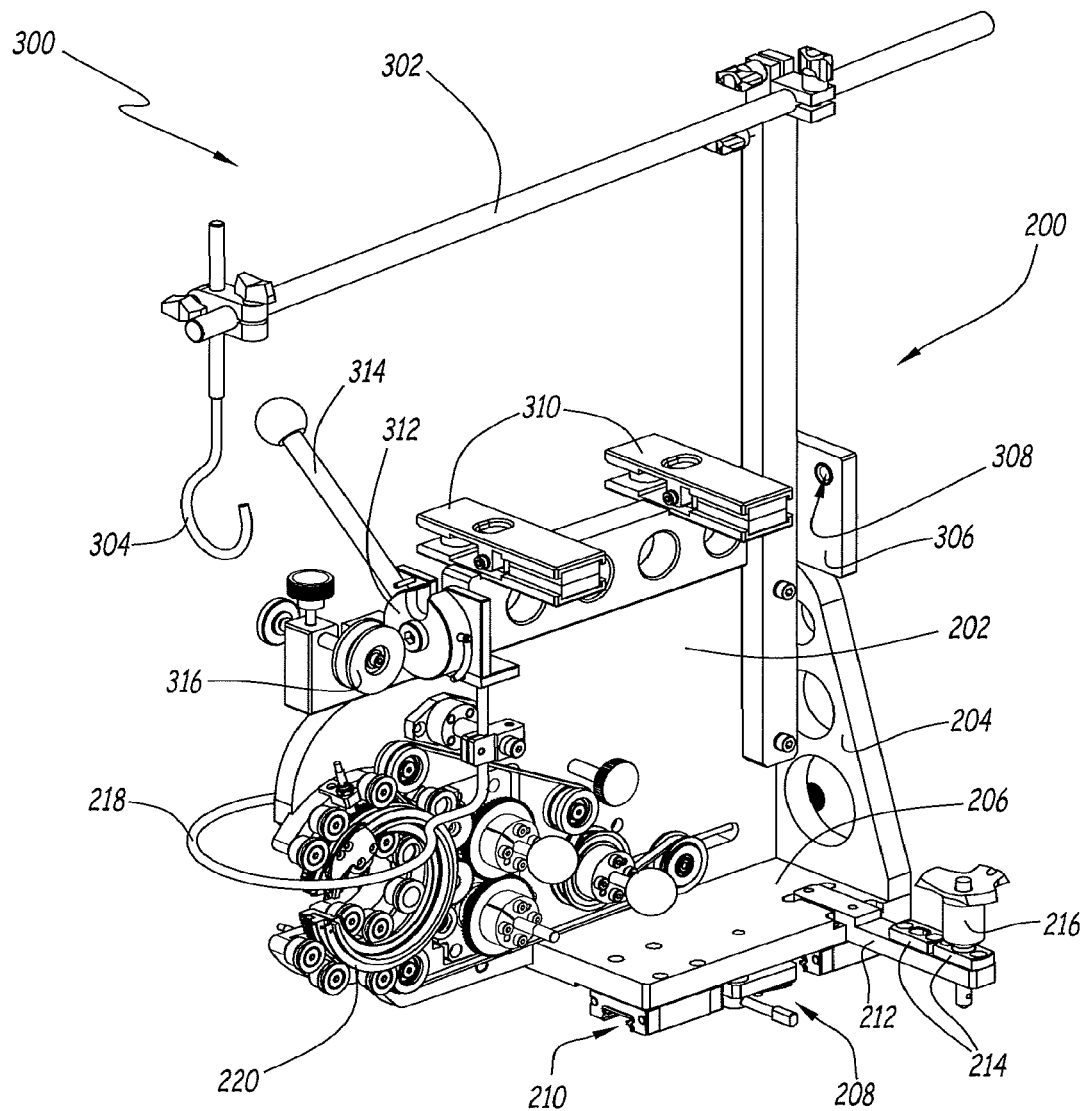
Figure 3:
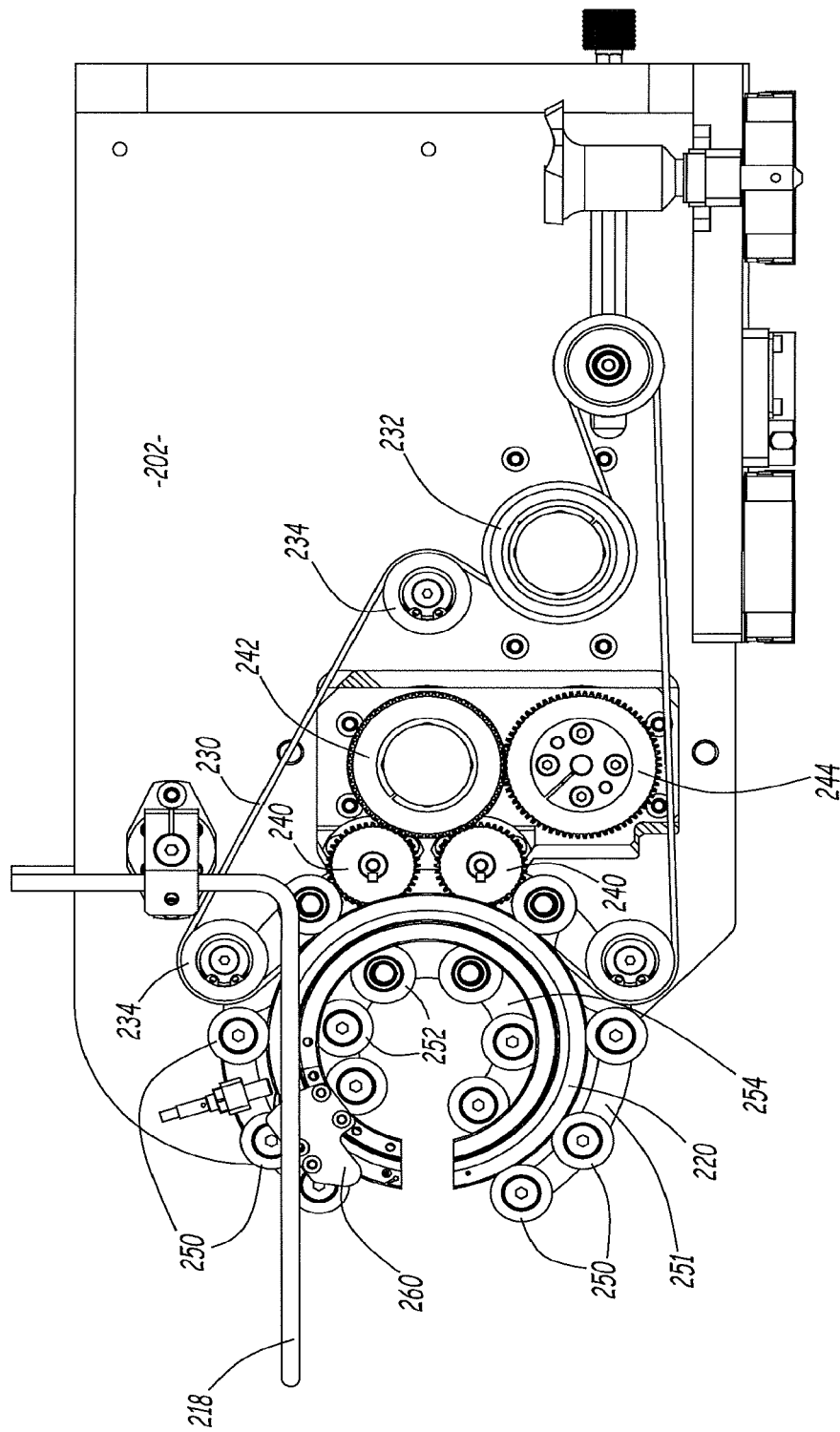
Figure 4:
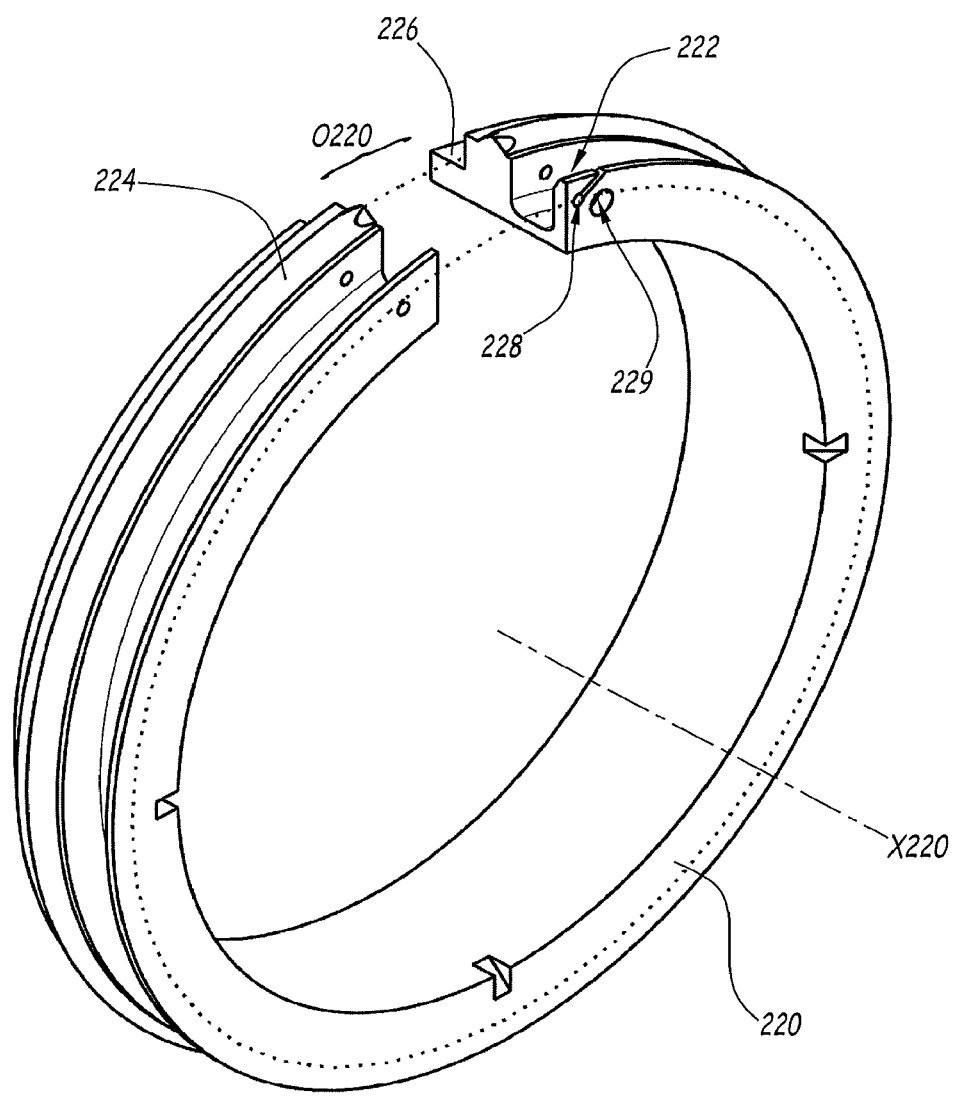
Figure 5:
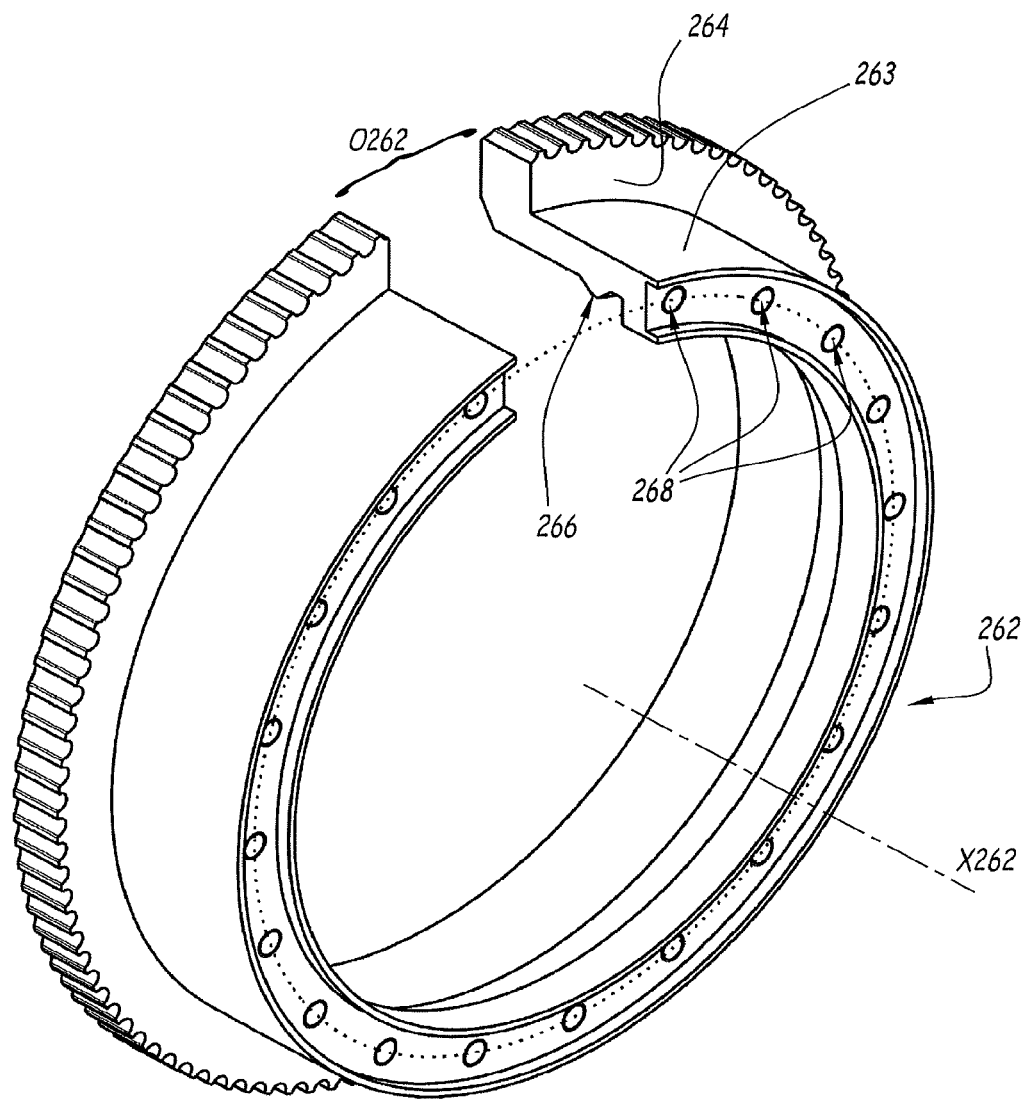
Figure 6:
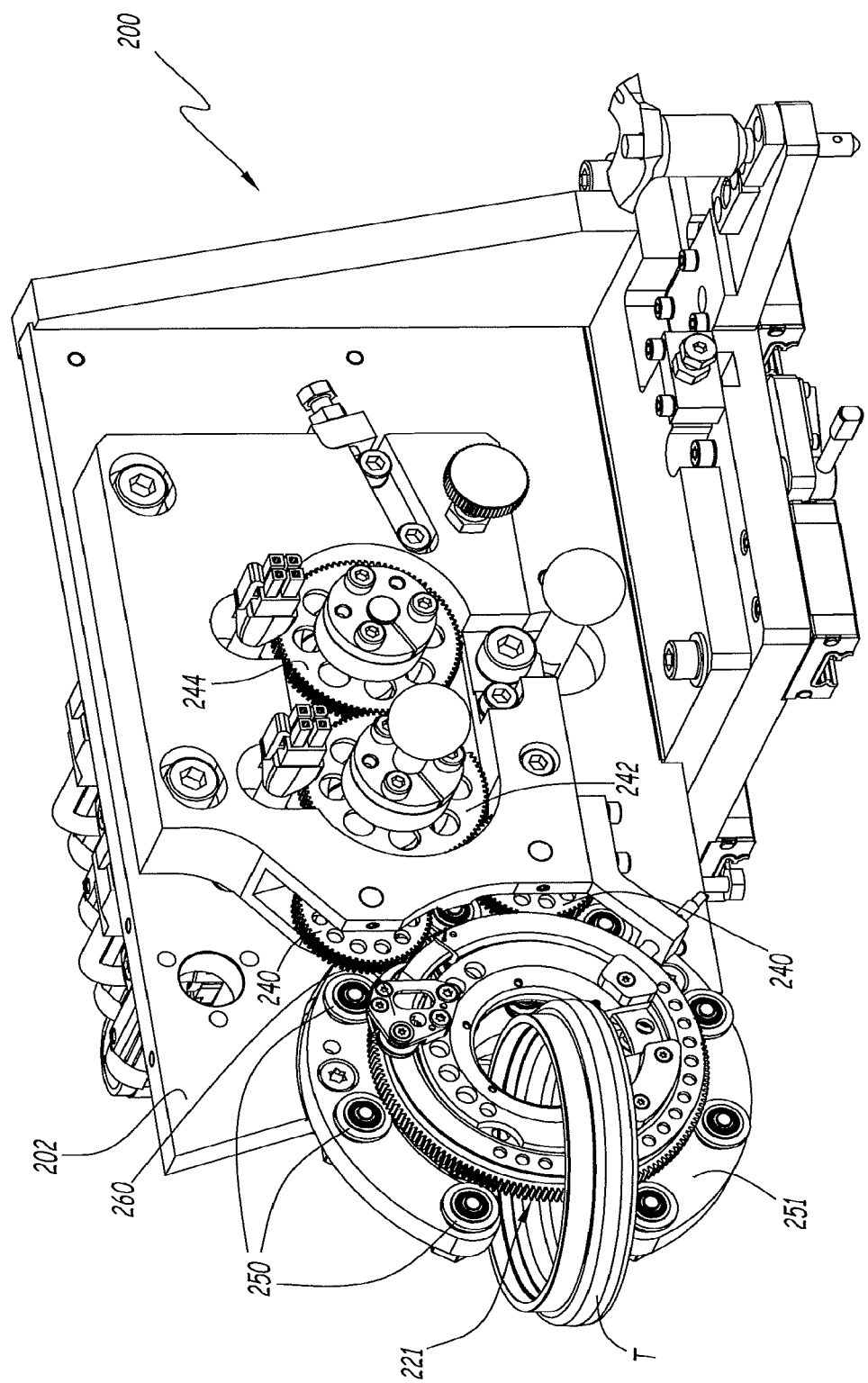
Figure 8:
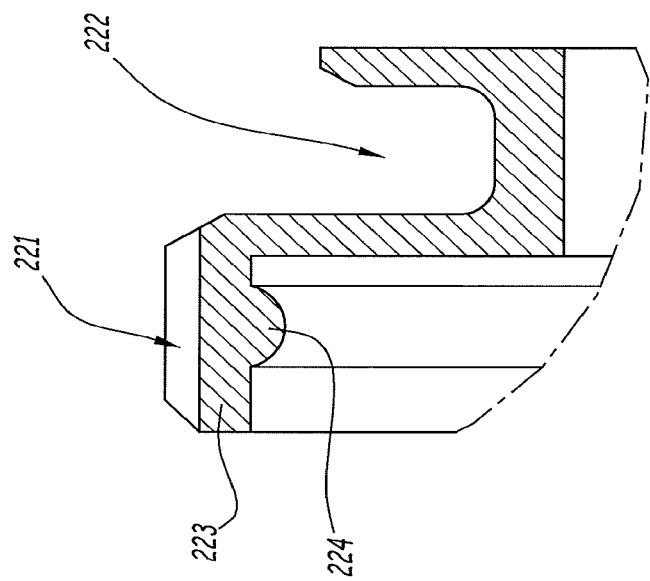
Figure 7:
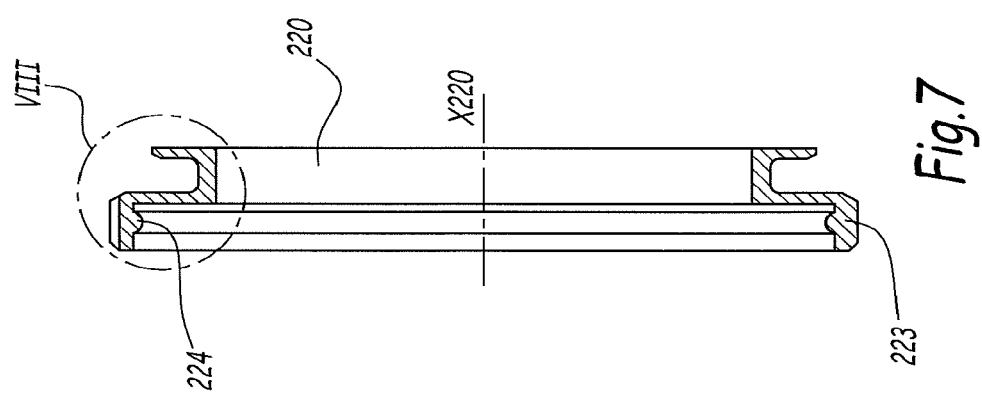
Figure 10:
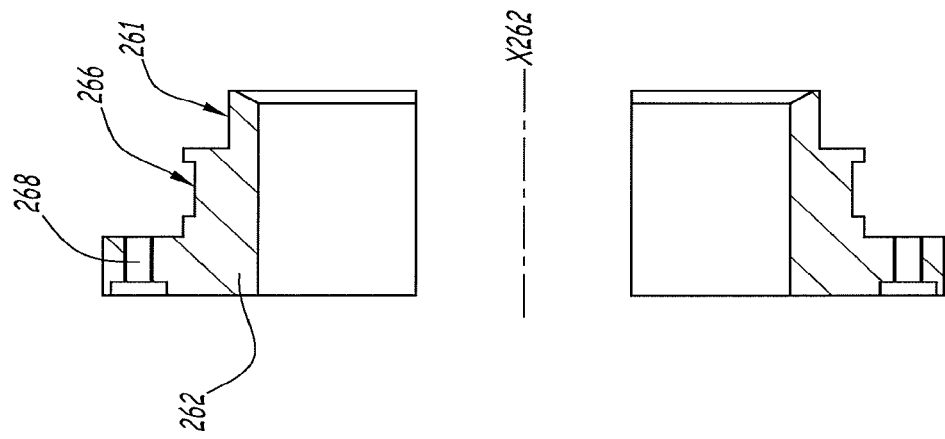
Figure 9:
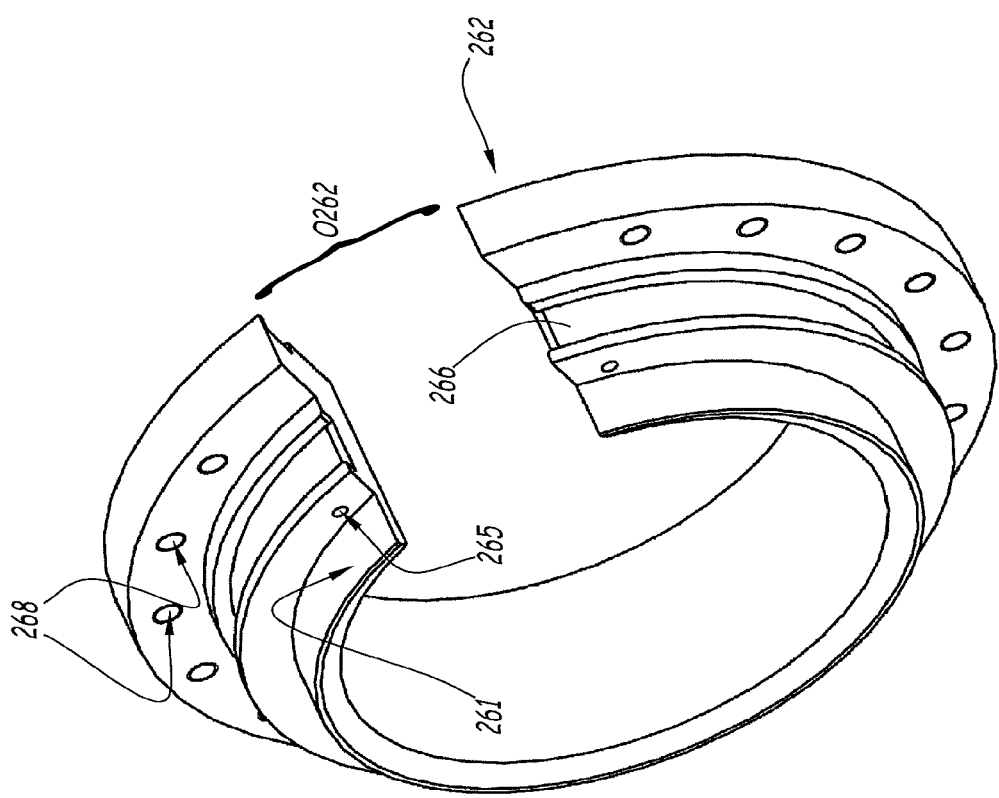
Figure 12:
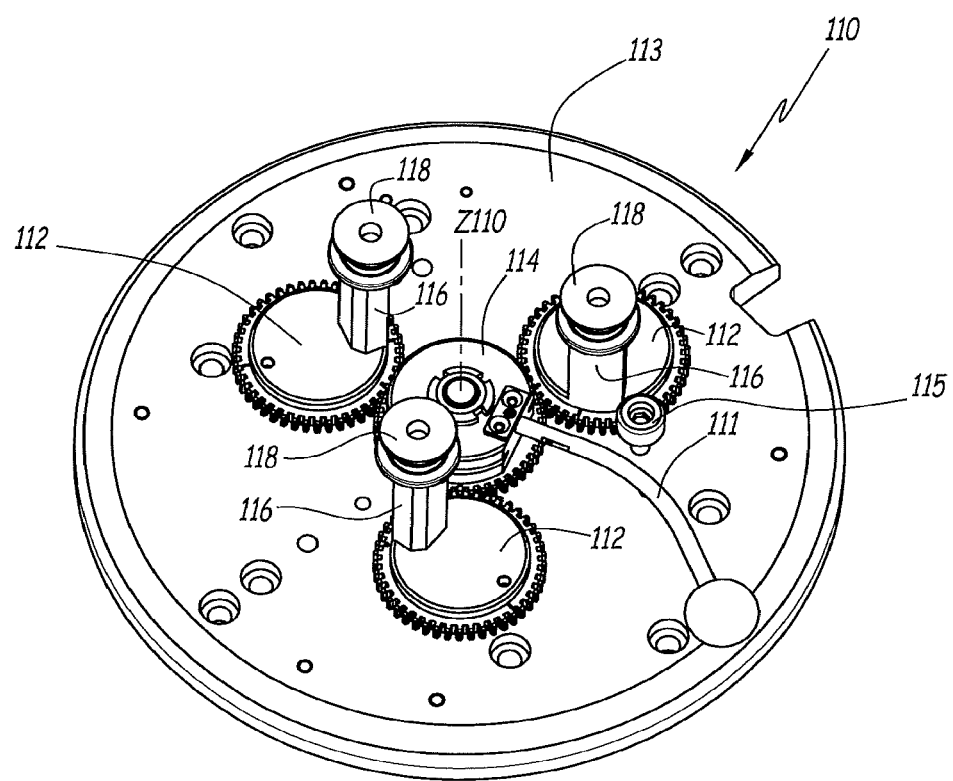
Figure 13:
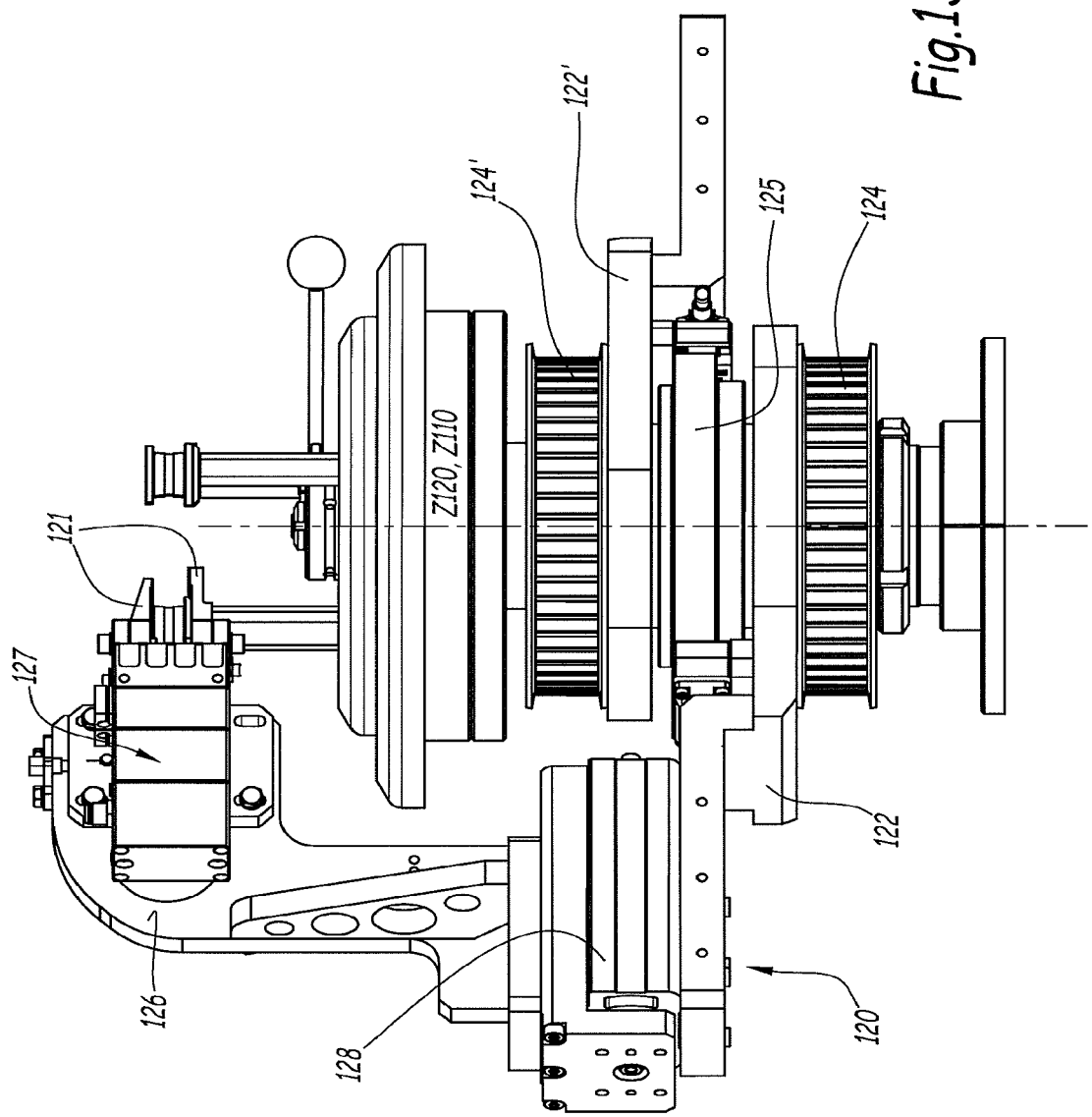
Figure 14:
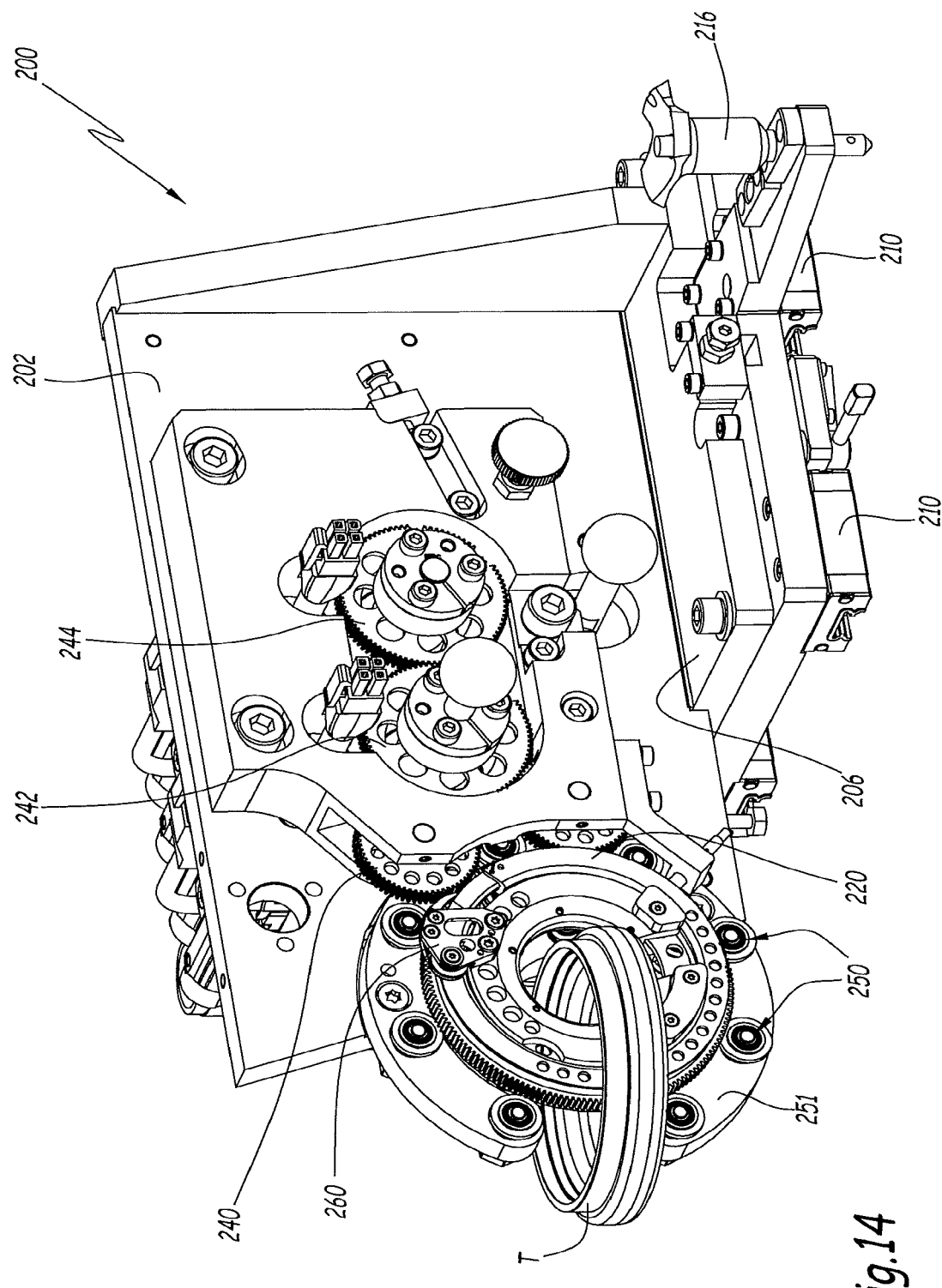
Figure 15:
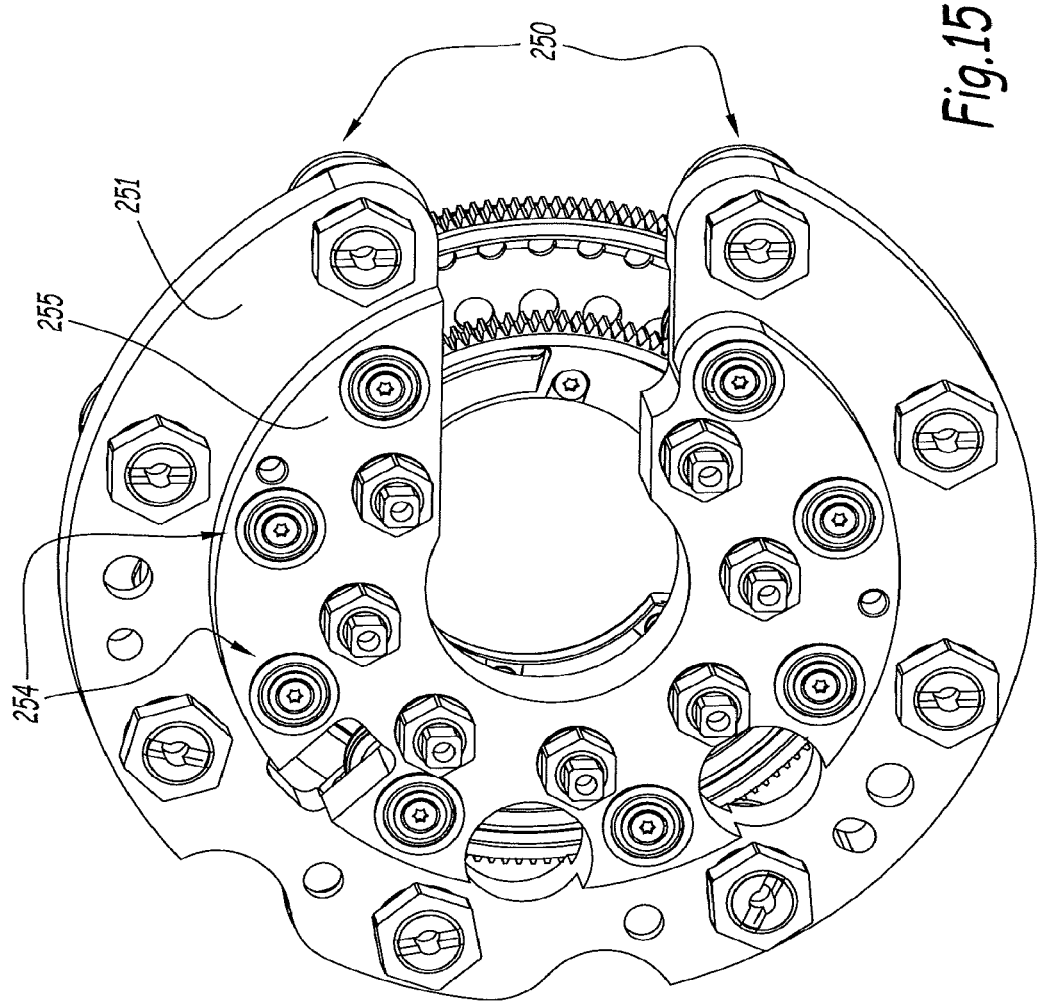
Figure 16:
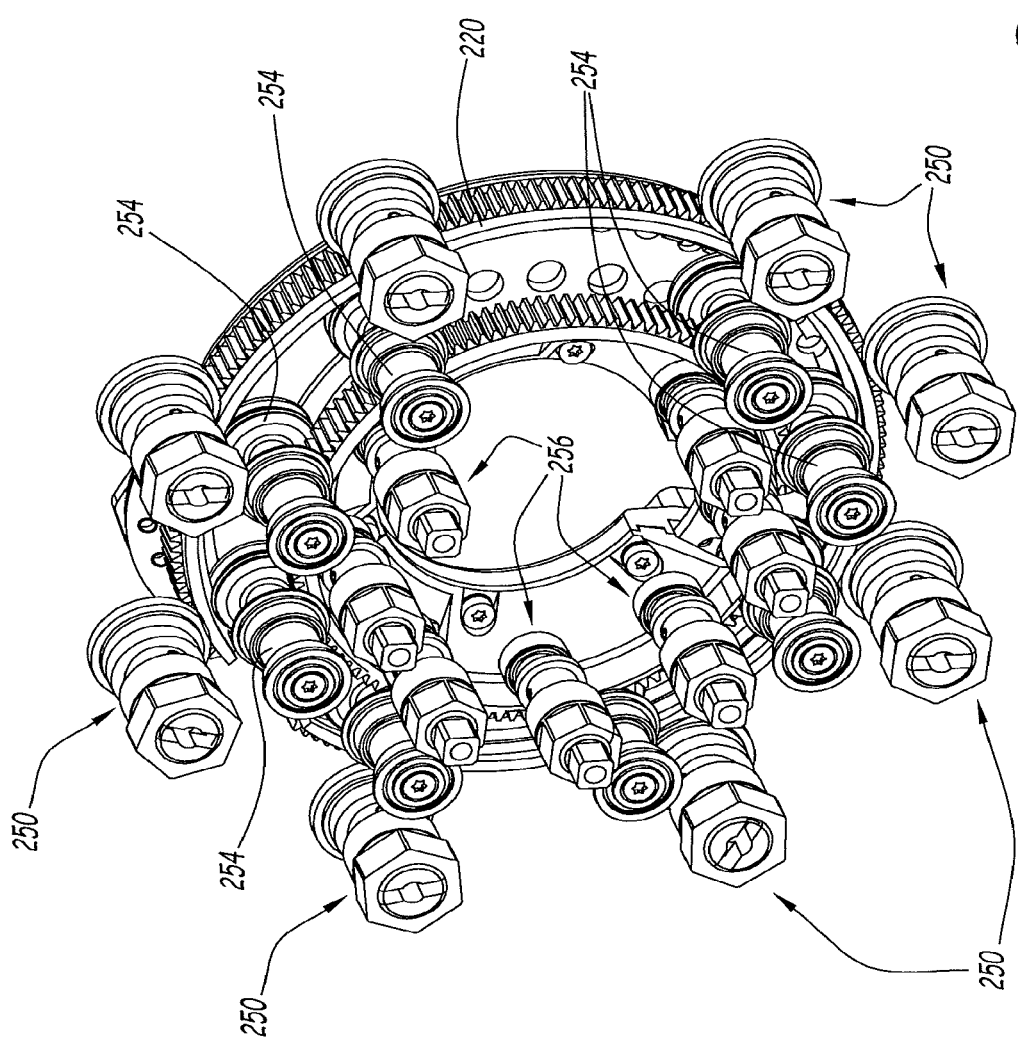

The invention and other advantages thereof will become more clearly apparent in light of the following description of three embodiments of a winding head according to its principle, given purely by way of example and with reference to the attached drawings in which:

FIG. 1 is a perspective view of a toroidal winding machine, comprising a winding head according to the invention, FIG. 2 is a perspective view of the winding head represented alone, FIG. 3 is a partial and side view of the winding head of FIG. 2, FIG. 4 is a perspective view of a magazine belonging to the winding head of FIGS. 2 and 3, FIG. 5 is a perspective view of a traveler fixing wheel belonging to the winding head of FIGS. 2 and 3, FIG. 6 is a perspective view of a second embodiment of a winding head according to the invention, FIG. 7 is a cross-sectional view of a magazine belonging to the winding head of FIG. 6, FIG. 8 is a larger scale view of the encircled part VIII in FIG. 7, FIG. 9 is a perspective view of a wheel for fixing the traveler belonging to the winding head of FIG. 6, FIG. 10 is a cross-sectional view of the wheel of FIG. 9, FIG. 11 is a perspective view of the winding table of the toroidal winding machine of FIG. 1, FIG. 12 is a perspective view of a concentric gripper belonging to the winding table of FIG. 11, FIG. 13 is a side view showing in particular a gripping clamp for a torus to be wound, FIG. 14 is a perspective view of a winding head according to a third embodiment of the invention, and FIGS. 15 and 16 are side views of a magazine-traveler assembly belonging to the winding head of FIG. 14.

FIG. 1 represents a toroidal winding machine M, allowing the production of wound toruses intended for the production of current measurement sensors. A wound torus comprises a support of toric form and a winding of conductive wire, notably of copper wire, which is wound on around the support. To produce such a wound torus, the support has to be driven in rotation about its axis so as to wind on winding wire over all its circumference.

The machine M comprises a winding table 100 for supporting and rotating a toric support T about its axis and a winding head 200 for performing the actual winding operation. The winding table 100 comprises an inclined support 102.

As can be seen in FIG. 2, the winding head 200 comprises a support plate 206, below which are fixed four linear guides 210, of which only two are represented in FIG. 2. The linear guides 210 allow the winding head 200 to be positioned in relation to the winding table 100. In the example, the linear guides 210 are ball recirculation skids conferring a high load capacity.

A brake 208 is interposed between two of the skids 210. The brake 208 has an actuation lever.

An arm 212, extending in the same plane as the support plate 206, bears two sleeves 214 each delimiting an oblong hole for passage of a pin 216. The pin 216 makes it possible to translationally immobilize the winding head 200 in relation to the winding table 100.

The winding head 200 also comprises a vertical plate 202, which is perpendicular to the support plate 206 and to which are fixed all the components required for the winding of the torus. In particular, the vertical plate 202 supports a magazine 220, the function of which is to store the quantity of wire required to wind a torus.

The toroidal winding machine M comprises a system 300 for bringing winding wire from a mother reel (not represented) situated behind the machine M to the magazine 220. In the example, the mother reel is installed on a sliding deck.

The system 300 comprises several guiding components, and in particular a plate 306 delimiting an orifice 308 for passage of the wire and two guiding members 310 positioned between the plate 306 and a wire-cutting system 312, which cutting system is able to be actuated manually by means of a lever 314. Finally, the system 300 comprises, at the end of the chain, a small wheel 316 with a V-shaped groove for guiding the winding wire to the magazine 220.

A boom 302 is also fixed to the vertical plate 202. The boom 302 is provided at its end with a hook 304 making it possible to attach an end of the winding wire when starting the torus winding sequence. A counterweight system (not represented) makes it possible to maintain a certain tension at the end of the winding wire. By virtue of this system, the tension value at the end of the wire upon starting the winding is repeatable over several sequences, in as much as the same counterweight is used. That was not the case in the prior art, where the end of the wire had to be held in the hand by the operator during the winding operation. This repeatability makes it possible to obtain low dispersions with regard to winding quality. Also, the safety of the operator is preserved and the risk of accident is reduced.

As can be seen in FIG. 4, the magazine 220 is of annular form, centred on an axis X220. The magazine 220 does not extend over all the periphery around the axis X220, since there is a permanent aperture O220 between the two ends of the magazine 220.

The magazine 220 delimits a peripheral groove 222 with U-shaped section, forming a storage volume for the winding wire.

The magazine comprises, on one of its side walls, a bellows-shaped slot 228 and/or a hole 229, for attaching an end of the winding wire. Depending on the section of the winding wire used and on the dexterity of the operator, the latter will be able to use the slot 228 or the hole 229 to attach the wire.

The magazine 220 delimits a peripheral setback 226 intended to receive a toothed crown wheel (not represented) and a rotation guiding profile. The rotation guiding profile is formed by a rib 224 which extends over all the perimeter of the magazine 220. This is described as external guidance. Advantageously, the section of the rib 224 is half-moon shaped.

The winding head 200 comprises a mechanism for driving the magazine 220 in rotation about the axis X220. This mechanism is represented in FIG. 3 in particular. It comprises two driving pinions 240, intended to cooperate with the teeth of the crown wheel of the magazine. The two pinions 240 are driven by a drive wheel 242, having complementary teeth. This drive wheel is linked to a first electric motor (not visible in the figures) positioned on the other side of the vertical plate 202. A second motor is provided. This second motor drives a toothed wheel 244 which is meshed with the wheel 242. The first and the second motors are current-driven.

The second motor acts selectively as a brake. It is referred to as a master-slave system. The first motor is called "master", while the second motor is called "slave". This arrangement allows a finer regulation of the mechanical tension of the wire during the winding. Effectively, it is known that the electric motors exhibit, at low speed, that is to say at low intensity, an operation which is not optimal. This is due in particular to phenomena of nonlinearity. The "slave" motor therefore makes it possible to be able to use the optimal operating range of the "master" motor in all circumstances, and in particular even when the tension level required necessitates a low motor torque. The motor drive block of the magazine 220 therefore comprises two motors working in differential torque mode. The mechanical principle is based on the 80/20 rule governing the operation of the motors. A motor has a linear torque when used over 80% of its range. Between 0 and 10% and 90 and 100%, the motors exhibit linearity issues. Consequently, to have a motor that is as stable as possible and therefore linear, it is necessary to use it to 50% of its capacities. In our case, the aim is to regulate a tension between 0 and 300 grams. That is why two motors are provided: one master and the other slave, working in differential torque mode to generate the tension of the wire by a torque delta with the motor drive of the traveler.

For example, at 75% of its scale of operation, the master motor (traveler) delivers a tension of 400 grams, the tension being defined as the product of the radius of the traveler, of the motor torque and of the motor/traveler reduction ratio. If it is assumed that the tension desired during the winding is 180 grams, then the slave motor (magazine) will have to generate a counter-load of 220 grams, i.e. 41.5% of its scale. This means that the two motors work within the their comfort range guaranteeing the most linear possible result.

As can be seen in FIG. 3, the rotation guiding means of the magazine 220 comprise a series of rotary rollers 250, distributed over the periphery of the magazine 220. Advantageously, the rollers 250 delimit a groove of section complementing that of the rib 224. In the example, they are each fitted around a mandrel belonging to a support ring 251, which is slotted.

As can be seen in FIG. 3, the winding head 200 comprises a traveler 260 for guiding the winding wire, at the output of the magazine 220, around the torus to be wound. The traveler 260 is provided to perform a circular trajectory around the section of the torus to be wound. In the present document, when describing the section of the torus to be wound, this is obviously the section of the torus in a half-plane of which the central axis of the torus can be considered as a generatrix. In other words, each point of the central axis of the torus is included in this half-plane. This section can be circular, oval, rectangular, etc.

Preferably, the traveler 260 and the magazine 220 are manufactured by 3D printing, particularly in titanium because titanium exhibits a relatively low density and a very low ductility coefficient.

The traveler 260 is fixed onto a bearing wheel 262, visible in particular in FIG. 5. In the example, the means for fixing the traveler 260 on the wheel 262 include an intermediate fixing piece (not represented) and screws. However, this fixing piece is optional, in as much as the traveler 260 could be fixed directly onto the wheel 262.

As can be seen in FIG. 5, the wheel 262 is centred on an axis X262 and extends over an angular segment strictly less than 360°. The wheel 262 effectively delimits a permanent aperture O262 between its two ends. It comprises a part 264 with teeth and a cylinder 263, intended to be engaged coaxially inside the magazine 220. On the side wall of the cylindrical part 263, there are orifices 268 for receiving screws (not represented) for fixing the traveler 260. The orifices are distributed over all the curvilinear length of the wheel 262, so as to be able to fix the traveler 260 anywhere.

The fact that the wheel 262 and the magazine 220 each delimit a permanent aperture for the passage of the torus is particularly advantageous, in particular when the wire breaks during the winding. In effect, with the machines of the prior art, and in particular with the RWE Evolution machine from RUFF GmbH, in case of wire breakage, it was necessary to manually and entirely reel off the magazine to be able to access the removable section and open the magazine. That was extremely time consuming. By virtue of the permanent apertures O220 and O262, respectively of the magazine and of the wheel, when the wire breaks, it is simply a matter, to extract the torus, of placing the openings O220 and O262 at the same level and to cut the quantity of wire extending between the two ends of the magazine. The torus can then be extracted quickly by opening the 3-finger concentric gripper (described hereinbelow) which bears the torus.

Also, because of the mechanical play in the link, the removable section of the RWE Evolution machine caused vibrations during the passage of the traveler. Furthermore, the section of the magazine was sometimes badly closed by the operator, which could result in untimely openings during the winding cycle. Lastly, the operation of the machine without this removable section was impossible because of the rotational driving of the traveler in direct contact with the magazine (the traveler was mounted on the magazine). All these problems have been resolved in the invention, which does not use such a removable magazine section.

As can be seen in FIG. 3, the wheel 262 is guided in rotation by a series of rollers 252 arranged inside the latter. This is referred to as internal guidance. The rollers 252 each comprise a groove cooperating with a peripheral rib 266 formed on the inner radial surface of the cylindrical part 263. Advantageously, the rib 266 has a half-moon shaped section.

The mechanism for driving the traveler 260 in rotation is visible in particular in FIG. 3. This mechanism comprises a notched belt 230 cooperating with the part with teeth 264 of the wheel 262. The belt 230 is driven by a drive pulley 232. Return pulleys 234 are provided to guide the belt 230 to the part with teeth 264 of the wheel 262.

The mechanism for driving the traveler 260 in rotation is distinct from the mechanism for driving the magazine 220 in rotation, such that the magazine 220 and the traveler 260 can be driven in rotation independently of one another. That makes it possible, among other things, to accurately adjust the tension value during the winding by modifying the speed differential between the magazine 220 and the traveler 260, the tension value being all the greater the higher the speed differential.

FIG. 6 represents a winding head according to a second embodiment of the invention. Hereinbelow, the elements that are identical or comparable to those of the first embodiment retain their numeric references, whereas the other elements bear other numeric references. Also, only the differences in relation to the first embodiment are mentioned for conciseness.

In the second embodiment, and as can be seen in FIGS. 7 and 8, the magazine 220 is guided in rotation internally and driven in rotation externally. It comprises a guiding/driving part 223, which is cylindrical, centred on the axis X220. This cylindrical part 223 comprises, on its inner radial surface, a peripheral rib 224, with a profile in section which is, in the example, half-moon shaped. The magazine 220 does not comprise an added toothed wheel, in as much as everything is of a single piece (one-piece): the cylindrical part 223 comprises, on its outer radial surface, teeth 221 for the rotational driving.

In this embodiment, the rotational guidance is performed externally, by means of a rolling bearing (not represented). The wheel 262 comprises a reception band 266 for rolling elements (not represented), such as balls or rollers. The wheel 262 extends over an angular segment strictly less than 360°. It delimits an aperture O262 for loading and unloading the torus at the centre of the magazine 220.

On the side wall, the wheel 262 delimits at least one orifice 265 for screwing a notched wheel (not visible in the figures) intended to cooperate with a notched belt comparable to that of the first embodiment. In particular, the notched wheel is intended to be mounted on a cylindrical setback 261 of the wheel 262.

FIGS. 14 to 16 represent a third and final embodiment of a winding head 200. Hereinbelow, only the differences in relation to the preceding embodiments are mentioned. The elements that are comparable or identical retain the same numeric references, new numeric references being used for the others.

The specific nature of this third embodiment relates to the components used for guiding the magazine 220 and the bearing wheel 262 of the traveler 260, the objective being to propose optimal rotational guiding means, despite the presence of permanent aperture zones formed in the magazine 220 and in the bearing wheel 262.

In particular, the idea is to ensure a guidance of the pieces both internally and externally. This principle has a name: it is guidance by feedback.

As can be seen in FIG. 16, the rotational guiding means of the magazine include so-called "external" rollers 250, of which there are advantageously eight and which are distributed over the periphery around the magazine, and so-called "internal" rollers 254, of which there are also eight and which are distributed over the inner perimeter of the magazine.

Here, the rollers 254 also form part of the rotational guiding means of the wheel 262 bearing the traveler 260. These means also include so-called "internal" rollers 256, of which there are advantageously eight and which are distributed over the inner perimeter of the bearing wheel 262.

Preferably, the rollers 254 and 256 are supported by one and the same flange 255, also having a permanent opening, comparable to the openings O220 and O262. Advantageously, each roller is mounted on an eccentric. That means that each roller can be displaced radially over a certain travel and therefore that the guiding diameter of the rollers is adjustable.

Independently of the above, the winding table 100 is also clearly distinguished from the prior art.

In the prior art, and in particular in the RWE Evolution machine from RUFF GmbH, the winding table comprises a system of rollers made of polyurethane, which have both a rotational driving function and a guiding function. In this example, there are three rollers. Each roller is mounted on a vertical cylinder, which is fixed to an end of an articulated connecting rod. Furthermore, each roller delimits a peripheral C-shaped groove to receive the torus. The position of the rollers is adjustable heightwise. Only two of the three rollers are mounted on motorized, that is to say rotary, cylinders. The third roller, which therefore has a guiding function only, has an additional degree of freedom, which is a displacement in translation. This third roller serves as presser roller. It is displaced in the steps of loading the bare torus and of unloading the wound torus.

One major drawback with this winding table lies in the difficulty in retaining the concentricity (or coaxiality) when changing torus diameter. In other words, it is difficult, when wanting to load a torus larger or smaller than the preceding torus, to centre the new torus on the same point as the preceding torus. Effectively, this operation is performed manually by displacing the rollers one by one and can take up to several hours, for an often approximate result. Furthermore, the centring dispersions of the toruses lead to disparities in the winding quality, that is to say toruses with a winding pitch that is variable from one torus to another.

Such problems are not found in the winding table 100 of the toroidal winding machine M according to the invention. The latter makes it possible to position the torus T more easily, particularly in case of change in diameter, and ensures that each torus wound by the machine is centred identically. This regularity in terms of centring makes it possible to obtain an equivalent winding quality for several torus diameters, that is to say a good winding repeatability.

Effectively, as can be seen in FIG. 11, the winding table 100, belonging to the toroidal winding machine M, comprises means 110 for supporting and guiding the torus T in rotation and means 120, 120' for driving the torus T in rotation which are distinct from the guiding means 110. The supporting and guiding means 110 are formed by a concentric gripping clamp. This gripper is supported by feet 104 extending from the support 102.

Preferably, and as can be seen in FIG. 12, the concentric gripping clamp 110 comprises three rollers 118 arranged such that each roller 118 remains permanently equidistant from the other two rollers and from a central axis Z110. This is commonly called a "three-finger concentric gripper".

Advantageously, each roller 118 is mounted on a cylinder 116 fixed eccentrically on a rotary pinion 112. Each roller 118 comprises a substantially V-shaped hollow part to receive the torus T. This hollow part, which extends, like a groove, overall the entire periphery of the roller, has a plane of symmetry at right angles to an axis of the roller. This symmetrical groove profile makes it possible to automatically centre the torus T in the concentric gripper 110, and therefore to avoid having the torus being positioned crosswise between the three rollers 118.

In the example, all the rotary pinions 112 are meshed with a central pinion 114, mobile about the axis Z110. The axis Z110 coincides with the central axis of the torus when the torus is positioned in the gripper. The rotation of the central pinion 114 drives the rotation of each pinion 112, and consequently the displacement of the rollers 118 relative to one another. The construction of this gripper 110 is such that the rollers 118 remain automatically equidistant from one another when the central pinion 114 is rotated. In the example, a lever 111 makes it possible to pivot the central pinion 114 to open the gripper more or less.

Advantageously, the three rollers 118 are mobile between a position of minimum opening and a position of maximum opening and are returned to the position of minimum opening by virtue of a counterweight system (not represented) acting on the central pinion 114. Thus, when the torus T is positioned in the gripper 110, the latter closes back automatically around the torus. Preferably, a closure abutment 115 is provided to limit the closure of the gripper 110. To put it another way, the abutment 115 defines a configuration of minimum opening (or of maximum closure), in which the rollers 118 are positioned closest to the central axis Z110.

In the example, the counterweight system comprises a cable (not represented), preferably of steel, which is wound on around the central pinion 114 and which is guided around one or more return pulleys (not represented) so as to be attached to a ballast (not represented) acting as counterweight. This counterweight offers the advantage of generating equivalent radial forces on the three rollers 118 throughout the winding cycle.

The ballast is formed by a threaded rod comprising a hook for attaching to the cable and by at least one weight screwed around the rod. The weight of the ballast is advantageously adjusted during the winding cycle so as to open the gripper 110 and compensate for the increase in section of the torus (because of the winding-on of the winding wire). The adjustment of the weight is performed by the addition of calibrated 50 g unit or 1 kg unit steel plates.

Shrewdly, the means for driving the torus T in rotation comprise at least two grippers 120 and 120', the two grippers 120 and 120' being rotationally mobile in a respective angular segment defined between two rollers 118, so as to be able to grip and displace in turn the torus to be wound T over a travel proportional to the angular spacing between two rollers. The grippers 120 and 120' can be qualified as "perimeter grippers".

Each of the grippers 120 and 120' is driven in rotation about an axis Z120 by an independent pulley-belt system, a part of which can be seen in FIG. 11. The axis of rotation Z120 of the grippers 120 and 120' coincides with the central axis Z110 of the three-finger gripper, and with the axis of the torus when the latter is positioned in the gripper 110. Also, the axis of rotation of the torus T coincides with the axes Z110 and Z120. The grippers 120 and 120' are each driven in rotation by virtue of an independent driving system. The driving system of the gripper 120 comprises an electric motor 140, a pulley 141, and a toothed belt 142. The motor 140 drives the pulley 141 and the pulley 142, which is a driving pulley, transmits a mechanical torque to a driven pulley 124 (visible in FIG. 13) via the toothed belt 142.

The gripper 120' has its own driving system, which is substantially identical to that of the gripper 120. It comprises an electric motor 140', a driving pulley 141' and a toothed belt 142'. The motor 140' transmits a torque to the pulley 141', which is transmitted to a driven pulley 124' via the belt 142'. The axis of rotation of the pulleys 124 and 124' coincides with the axis Z120.

An epicycloidal gear and a roller bearing are positioned at the output of each motor 140 and 140' so as to absorb the radial forces (centrifugal forces). Hereinbelow, only the gripper 120 is described, the gripper 120' being identical. The gripper 120 comprises what is called a regulator 122, which is secured in rotation to the pulley 124. A corresponding regulator 122' is provided for the gripper 120'. The regulator 122' is secured in rotation to the pulley 124'. The regulators 122 and 122' are provided in metal.

As can be seen in FIG. 13, the regulator 122 supports a linear actuator 128, of electrical thruster type, comprising a fixed part and a mobile part. The mobile part of the thruster can be displaced according to a radial direction in relation to the axis Z120. A swan-neck-form part 126 is mounted on the mobile part of the linear actuator 128. This swan-neck part 126 bears a parallel-jaw electrical gripper equipped with two jaws 121 adapted to the geometry of the torus to be wound T. The jaws 121 are parallel and are mobile toward one another, so as to be able to grip toruses of different templates. To this end a micrometre table 127, serving as mechanical interface between the swan-neck-form part 126 and the jaws 121, makes it possible to adjust the position of the jaws 121 heightwise.

The winding table comprises a system for automatically controlling the angular position of the torus during the winding operation. In the example, this system comprises a measurement means in the form of an incremental rotary coder 125, which is advantageously mounted directly around the central shaft (not represented) secured to the regulators 122 and 122'. In particular, the coder is interposed between the regulators 122 and 122' to guarantee the highest level of accuracy.

The displacement of the grippers 120 and 120' is controlled by a dedicated processor, capable of managing the angular displacement of the grippers (starting position, end-of-travel position, angular velocity, etc.) and the opening and closing sequences of the jaws 121.

To ensure a qualitative and repeatable winding, the section of the torus to be wound is advantageously positioned at the centre of the magazine 220. Thus, upon a change of diameter, it is necessary to reposition the winding head 200 in relation to the table 100. As can be seen in FIG. 11, the winding table 200 therefore comprises two rails 130, which are profile-section rails with ball recirculation and high load capacity. These rails 130 are configured to guide skids 220 of the winding head 200. The process involved here is called a depthwise adjustment of the winding head 200 in relation to the winding table 100. In the example, the depthwise adjustment means 130 are configured to displace the winding head 100 in a plane radial to the axis Z120 or Z110 of rotation of the torus T. That offers the advantage that the wire is deposited in this same radial plane, and therefore that the turns are indeed parallel to one another.

Advantageously, the fact of being able to retract the winding head 200 in relation to the winding table 100 also makes it possible to intervene more easily on the components of the head 200 in maintenance operations and also when certain mechanical adjustments have to be made.

In the example, the machine M is designed for the winding of three toruses of different diameters. As a variant, the latter could be designed for a greater number of diameters. The winding table 100 comprises an indexing device 132, visible only in FIG. 11, and making it possible to ensure an accurate positioning of the winding head 200 in three positions. This indexing device 132 delimits three housings for positioning the pin 216. The locking of the pin 216 in one of the three housings determines the axial position of the winding head 200 along the rails 130.

Advantageously, the indexing device 132 is provided with pin detection sensors. There is a detection sensor for each housing. These sensors make it possible to obtain feedback on the position of the winding head 200 in relation to the table 100 which has been selected.

In each embodiment, the winding of a torus is performed as follows.

The magazine 220 is advanced until the centre of the magazine 220 is positioned precisely around a section of the torus. A (bare) torus to be wound is positioned in the concentric gripper 110, and in particular between the three rollers 118 of the gripper. For that, the operator can displace the winding head along the rails 130, until it reaches the position corresponding to the diameter of the torus selected.

The magazine 220 is then loaded with the quantity of wire required to wind the torus. For this, the winding wire is pulled by virtue of the system 300 from a mother reel, in particular a reel of copper wire. One end of the winding wire is then attached to the magazine, for example to the hole 229 or to the bellows-shaped slot 228 and the magazine is driven in rotation.

The number of turns performed by the magazine can advantageously be programmed as a function of the diameter of the torus to be wound. It can also be computed based on the number of turns to be wound.

The winding wire is stored in the U-shaped groove 222. When the quantity of wire required for the winding has been loaded, the rotation of the magazine 220 is stopped and the operator cuts the wire, notably using the wire-cutting system 312. The loading phase is finished.

Next, the operator passes the wire through the guiding channel of the traveler, then makes a few dead turns around an element of the torus to be wound, this element being able to be a spindle (not represented) or a section of the torus. Finally, the wire is introduced into the wire-guide system 218 and the end of the wire is attached to the hook 304 of the hanger system 302. A ballast (not represented) is joined to the system 302 so as to place the winding wire under tension. In the absence of spindle, the starting wire is kept taut toward the back of the machine. The winding starts and after ten or so turns, the operator can bring the wire back to the hook of the hanger and attach the counterweight thereto.

The winding process can then begin. The operator programs the characteristics associated with the winding sequence, such as the desired tension level, the winding pitch, etc.

The traveler is displaced in rotation about the section of the torus to be wound and pulls the wire stored in the magazine. The magazine is then also driven in rotation by the wire consumption which occurs, but with a lesser speed. The rotation of the traveler progressively drives the winding-on of the copper wire around the section of the torus to be wound.

In parallel, the torus is displaced in rotation about its axis, synchronously with the rotation of the traveler. In particular, the grippers 120 and 120' in turn come to grip the torus to displace it in rotation over an angular segment corresponding substantially to the angle between two rollers 118, i.e. 120°. The travel of the grippers 120 and 120' is all the greater the greater the diameter of the torus.

One or more layers of wires can be applied around the torus. For each layer, the torus can perform a complete turn. A programmed segment can correspond to a layer or a part of the layer (it may be necessary to break down a layer into several segments when, for example, wanting to generate a different winding density over the start or the end of a layer, that is to say very locally). Each segment is defined by the direction of rotation of the torus, the winding pitch used, the number of turns, the speed, the acceleration (and deceleration), the winding tension and a stop (machine stoppage), for example at the end of a segment. The parameters of each segment can therefore be modified as desired, which offers a certain programming flexibility.

In a variant not represented, the notched belt 230 is replaced by one or more driving pinions. In particular, the driving mechanism of the traveler 260 could include two small pinions, each interposed between two rollers 254. A removable motor block will then be able to be used to drive the pinions.

According to another variant not represented, the number of rollers of the concentric gripper 110 can be greater than three.

The features of the variants and embodiments envisaged above can be combined with one another to generate novel embodiments of the invention.

The invention claimed is:

1. A winding head for a toroidal winding machine, the winding head comprising:
    an annular magazine configured to store a quantity of wire required to wind a torus;
    a first mechanism configured to drive the magazine in rotation;
    a traveller disposed to overlap the magazine and configured to guide wire from an output of the magazine to wind around the torus; and
    a second mechanism, distinct from the first mechanism, configured to drive the traveller in rotation independently of the magazine,
    wherein the traveller is fixed onto a side wall of a wheel mounted coaxially inside the magazine.

2. The winding head according to claim 1, wherein the magazine and the wheel extend over an angular segment less than 360° to define a permanent aperture for passage of the torus.

3. The winding head according to claim 1, further comprising a first guide configured to guide the magazine in rotation, and a second guide, distinct from the first guide, configured to guide the rotation of the traveller.

4. A toroidal winding machine, comprising a winding head according to claim 1 and a winding table, configured to support and rotate a torus during a winding sequence.

5. The machine according to claim 4, wherein the winding table comprises a concentric gripping clamp support configured to support and guide the torus in rotation and a drive mechanism configured to drive the torus in rotation.

6. The machine according to claim 5, wherein the concentric gripping clamp comprises three rollers positioned such that each roller remains permanently equidistant from the other two rollers.

7. The machine according to claim 6, wherein each roller is mounted on a cylinder fixed eccentrically onto a rotary pinion and in that all the rotary pinions are meshed with a central pinion.

8. The machine according to claim 5, wherein an axis of rotation of the torus coincides with a central axis of the concentric gripping clamp.

9. A method for winding a torus with a machine according to claim 5, the method comprising: positioning the torus in the concentric gripping clamp,
- displacing the winding head until reaching a position where a section of the torus to be wound is substantially at a center of a circle described by the traveller,
- using the drive mechanism to rotate the torus, and
- displacing the magazine and the traveller in rotation about the section of the torus to reel off wire stored in the magazine around the section of the torus.

10. The machine according to claim 4, wherein the winding table comprises an adjustment mechanism configured to adjust the winding head depthwise.

11. The machine according to claim 10, wherein the adjustment mechanism is configured to displace the winding head in a plane radial to an axis of rotation of the torus.

* * * * *